US010109737B2

(12) United States Patent
Hashemi et al.

(10) Patent No.: US 10,109,737 B2
(45) Date of Patent: Oct. 23, 2018

(54) METHOD OF FORMING HIGH-GERMANIUM CONTENT SILICON GERMANIUM ALLOY FINS ON INSULATOR

(71) Applicant: International Business Machines Corporation, Armonk, NY (US)

(72) Inventors: Pouya Hashemi, White Plains, NY (US); Renee T. Mo, Yorktown Heights, NY (US); John A. Ott, Greenwood Lake, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/614,013

(22) Filed: Jun. 5, 2017

(65) Prior Publication Data
US 2017/0271502 A1    Sep. 21, 2017

Related U.S. Application Data (62) Division of application No. 14/860,144, filed on Sep. 21, 2015, now Pat. No. 9,680,018.

(51) Int. Cl.
*H01L 29/66* (2006.01)
*H01L 29/78* (2006.01)
(Continued)

(52) U.S. Cl.
CPC ...... *H01L 29/785* (2013.01); *H01L 21/02164* (2013.01); *H01L 21/02236* (2013.01);
(Continued)

(58) Field of Classification Search
CPC ............ H01L 29/785; H01L 29/66795; H01L 27/1211; H01L 21/02255; H01L 21/02532;
(Continued)

(56) References Cited

U.S. PATENT DOCUMENTS 7,196,372 B1 * 3/2007 Yu ..................... H01L 21/28273
257/315
8,211,772 B2 7/2012 Kabalieros et al.
(Continued)

OTHER PUBLICATIONS

List of IBM Patents or Patent Applications Treated as Related dated Jun. 5, 2017, 2 pages.

*Primary Examiner* — Bitew Dinke
(74) *Attorney, Agent, or Firm* — Scully, Scott, Murphy & Presser, P.C.; Daniel P. Morris, Esq.

(57) ABSTRACT

A method of forming high germanium content silicon germanium alloy fins with controlled insulator layer recessing is provided. A silicon germanium alloy (SiGe) layer having a first germanium content is provided on a surface of an insulator layer using a first condensation process. Following the formation of a hard mask layer portion on the SiGe layer, a second condensation process is performed to convert a portion of the SiGe layer into a SiGe fin of a second germanium content that is greater than the first germanium content and other portions of the SiGe layer into a shell oxide structure located on sidewalls of the SiGe fin. After forming a fin placeholder material, a portion of each shell oxide structure is removed, while maintaining a lower portion of each shell oxide structure at the footprint of the SiGe fin.

13 Claims, 7 Drawing Sheets (51) Int. Cl.
*H01L 21/02* (2006.01)
*H01L 27/12* (2006.01)

(52) U.S. Cl.
CPC .. *H01L 21/02255* (2013.01); *H01L 21/02532* (2013.01); *H01L 21/02592* (2013.01); *H01L 21/02595* (2013.01); *H01L 27/1211* (2013.01); *H01L 29/66545* (2013.01); *H01L 29/66795* (2013.01)

(58) Field of Classification Search
CPC ......... H01L 21/02164; H01L 21/02595; H01L 21/02592; H01L 29/66545; H01L 21/02236; H01L 21/823431; H01L 21/823821; H01L 21/845
See application file for complete search history.

(56) References Cited

U.S. PATENT DOCUMENTS

| | | | |
|---|---|---|---|
| 8,395,195 B2 | 3/2013 | Chang et al. | |
| 8,497,177 B1 | 7/2013 | Chang et al. | |
| 9,343,500 B2 | 5/2016 | Mabuchi | |
| 9,431,483 B1 | 8/2016 | Wen et al. | |
| 9,496,400 B1* | 11/2016 | Balakrishnan | H01L 29/785 |
| 9,536,900 B2 | 1/2017 | Ramachandran et al. | |
| 2005/0023633 A1* | 2/2005 | Yeo | H01L 21/84 257/500 |
| 2005/0186742 A1* | 8/2005 | Oh | H01L 29/66818 438/283 |
| 2006/0057802 A1* | 3/2006 | Nowak | H01L 27/1203 438/206 |
| 2006/0068531 A1* | 3/2006 | Breitwisch | H01L 21/84 438/149 |
| 2006/0157794 A1* | 7/2006 | Doyle | H01L 29/66795 257/368 |
| 2006/0197147 A1* | 9/2006 | Anderson | H01L 29/42384 257/331 |
| 2007/0158764 A1* | 7/2007 | Orlowski | H01L 21/823431 257/401 |
| 2008/0001225 A1* | 1/2008 | Furukawa | H01L 29/42384 257/347 |
| 2008/0135886 A1* | 6/2008 | Irisawa | H01L 21/84 257/255 |
| 2009/0294919 A1 | 12/2009 | Stephens et al. | |
| 2010/0144121 A1 | 6/2010 | Chang et al. | |
| 2012/0025313 A1 | 2/2012 | Chang et al. | |
| 2012/0261643 A1* | 10/2012 | Cohen | B82Y 10/00 257/27 |
| 2013/0334571 A1* | 12/2013 | Reznicek | H01L 21/02381 257/192 |
| 2014/0030876 A1* | 1/2014 | Flachowsky | H01L 21/823431 438/479 |
| 2014/0077277 A1* | 3/2014 | Bao | H01L 29/06 257/288 |
| 2014/0252483 A1 | 9/2014 | Nagumo | |
| 2015/0214351 A1* | 7/2015 | Basker | H01L 29/785 257/19 |
| 2015/0318216 A1* | 11/2015 | Cheng | H01L 21/76283 438/221 |
| 2015/0372140 A1* | 12/2015 | Liu | H01L 29/7848 257/190 |
| 2016/0071956 A1* | 3/2016 | Balakrishnan | H01L 29/66818 257/401 |
| 2016/0247731 A1* | 8/2016 | Balakrishnan | H01L 21/3083 |

* cited by examiner

METHOD OF FORMING HIGH-GERMANIUM CONTENT SILICON GERMANIUM ALLOY FINS ON INSULATOR

BACKGROUND

The present application relates to semiconductor technology, and more particularly to a method of forming a semiconductor structure containing high germanium content silicon germanium alloy fins located on an insulator layer. The present application also relates to a semiconductor structure that is formed by the method of the present application.

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that MOSFETs are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of complementary metal oxide semiconductor (CMOS) devices. Semiconductor FinFETs can achieve higher drive currents with increasingly smaller dimensions as compared to conventional planar FETs.

Silicon germanium alloy fins having a germanium content of greater than 50 atomic percent are considered for 7 nm technology node and beyond. Achieving such high germanium content silicon germanium alloy fins on an insulator layer with conventional epitaxial growth and fin patterning for target fin widths are very challenging and is limited by various issues such as, for example, defectivity. Condensation is one approach that can be used to achieve high germanium content silicon germanium alloy fins however the non-uniform oxide removal from the sidewalls of the high germanium content silicon germanium alloy fins is very challenging resulting, in some cases, in fin detachment from the underlying insulator layer as well as too much insulator layer recess, which may cause a problem in subsequent processing steps.

In view of the above, there is a need for providing a method of forming high germanium content silicon germanium alloy fins on an insulator layer that avoids the drawbacks associated with the prior art mentioned above.

SUMMARY

A method of forming high germanium content silicon germanium alloy fins with controlled insulator layer recessing is provided. A silicon germanium alloy layer having a first germanium content is first provided on a surface of an insulator layer using a first condensation process. Following the formation of a nitride-containing hard mask layer portion on a topmost surface of the silicon germanium alloy layer, a second condensation process is performed to convert a portion of the silicon germanium alloy layer into a silicon germanium alloy fin of a second germanium content that is greater than the first and other portions of the silicon germanium alloy layer into a shell oxide structure located on sidewalls of the silicon germanium alloy fin. After forming a fin placeholder material, a portion of each shell oxide structure is removed, while maintaining a lower portion of each shell oxide structure at the footprint of each silicon germanium alloy fin. Such a method avoids unwanted recessing of the insulator layer as well as avoiding unwanted fin detachment.

In one aspect of the present application, a method of forming a semiconductor structure is provided. In one embodiment of the present application, the method includes forming at least one nitride-containing hard mask layer portion having a first width on a topmost surface of a silicon germanium alloy layer having a first germanium content, the silicon germanium alloy layer has a bottommost surface directly contacting a topmost surface of an insulator layer. Next, a condensation process is performed to convert a portion of the silicon germanium alloy layer having the first germanium content beneath each nitride-containing hard mask layer portion into a silicon germanium alloy fin having a second germanium content that is greater than the first germanium content and a second width that is less than the first width, while converting other portions of the silicon germanium alloy layer having the first germanium content into a shell oxide structure. A fin placeholder material portion is then formed surrounding the silicon germanium alloy fin and each shell oxide structure, the fin placeholder material portion having a topmost surface that is coplanar with a topmost surface of each nitride-containing hard mask layer portion. Next, each nitride-containing hard mask layer portion is removed to provide an opening located atop the silicon germanium alloy fin and each shell oxide structure. Each shell oxide layer structure is then recessed to provide shell oxide structure portions, each shell oxide structure portion having a sidewall surface directly contacting a lower sidewall surface of the silicon germanium alloy fin, a bottommost surface directly contacting a portion of the insulator layer and a topmost surface that is located beneath a topmost surface of the silicon germanium alloy fin.

In another aspect of the present application, a semiconductor structure is provided. In one embodiment of the present application, the semiconductor structure includes at least one silicon germanium alloy fin having a germanium content of greater than 50 atomic percent located on a portion of an entirely planar topmost surface of an insulator layer. The semiconductor structure of the present application further includes a shell oxide structure portion located on each side of the at least one silicon germanium alloy fin. Each shell oxide structure portion has a sidewall surface directly contacting a lower sidewall surface of the at least one silicon germanium alloy fin, a bottommost surface directly contacting another portion of the entirely planar topmost surface of the insulator layer and a topmost surface that is located beneath a topmost surface of the at least one silicon germanium alloy fin.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
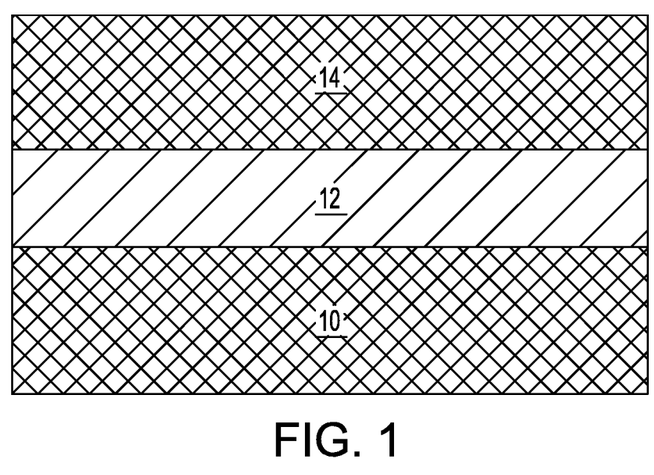
FIG. 1 is a cross sectional view of an exemplary semiconductor structure including, from bottom to top, a handle substrate, an insulator layer, and a silicon layer that can be employed in one embodiment of the present application.

Referring first to FIG. 1, there is illustrated an exemplary semiconductor structure including, from bottom to top, a handle substrate 10, an insulator layer 12, and a silicon layer 14 that can be employed in one embodiment of the present application. Collectively, the handle substrate 10, the insulator layer 12, and the silicon layer 14 can be referred to herein as a silicon-on-insulator (SOI) substrate. The handle substrate 10 provides mechanical support to the insulator layer 12 and the silicon layer 14. In some embodiments of the present application, the handle substrate 10 can be omitted.

In some embodiments of the present application, the handle substrate 10 may comprise a semiconductor material. The term "semiconductor" as used herein in connection with the semiconductor material of the handle substrate 10 denotes any semiconducting material including, for example, Si, Ge, SiGe, SiC, SiGeC, III/V compound semiconductors or II-VI compound semiconductors. Multilayers of these semiconductor materials can also be used as the semiconductor material of the handle substrate 10. In one embodiment, the handle substrate 10 comprises silicon. In some embodiments, the handle substrate 10 is a non-semiconductor material including, for example, a dielectric material and/or a conductive material.

The handle substrate 10 and the silicon layer 14 may have the same or different crystal orientation. For example, the crystal orientation of the handle substrate 10 and/or the silicon layer 14 may be {100}, {110}, or {111}. Other crystallographic orientations besides those specifically mentioned can also be used in the present application. The handle substrate 10 of the SOI substrate may be a single crystalline semiconductor material, a polycrystalline material, or an amorphous material. Typically, the silicon layer 14 is single crystalline silicon.

The insulator layer 12 may be a crystalline or non-crystalline oxide or nitride. In one embodiment, the insulator layer 12 is an oxide such as, for example, silicon dioxide. In another embodiment, the insulator layer 12 is a nitride such as, for example, silicon nitride or boron nitride. In yet other embodiments, the insulator layer 12 is a multilayered stack of, in any order, silicon dioxide and boron nitride. The insulator layer 12 has an entirely planar topmost surface that, due to the processing of the present application, is maintained.

The SOI substrate may be formed utilizing standard processes including for example, SIMOX (Separation by IMplantation of OXygen) or layer transfer. When a layer transfer process is employed, an optional thinning step may follow the bonding of two semiconductor wafers together. The optional thinning step reduces the thickness of the silicon layer 14 to a layer having a thickness that is more desirable.

In some embodiments, the thickness of silicon layer 14 is from 5 nm to 100 nm. Other thicknesses that are lesser than, or greater than, the aforementioned thickness range may also be employed in the present application. The insulator layer 12 typically has a thickness from 1 nm to 200 nm. Other thicknesses that are lesser than, or greater than, the aforementioned thickness range may also be used as the thickness of the insulator layer 12. The thickness of the handle substrate 10 is inconsequential to the present application.

Figure 2:
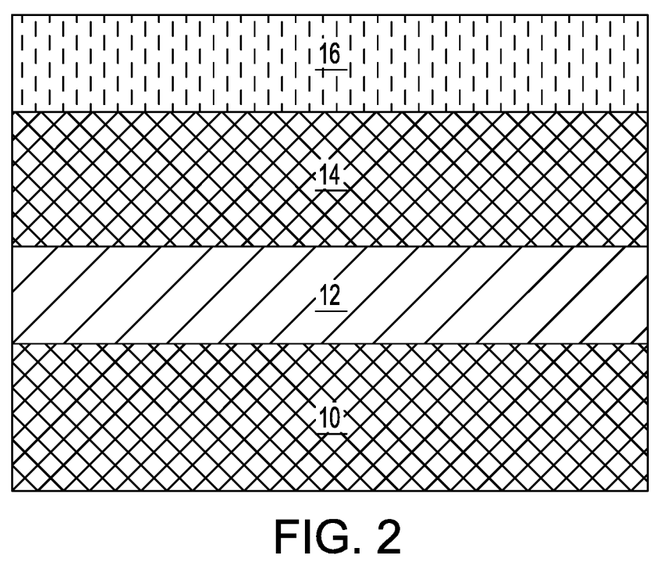
FIG. 2 is a cross sectional view of the exemplary semiconductor structure of FIG. 1 after forming a sacrificial silicon germanium alloy layer on a surface of the silicon layer.

Referring now to FIG. 2, there is illustrated the exemplary semiconductor structure of FIG. 1 after forming a sacrificial silicon germanium alloy layer 16 on a surface of the silicon layer 14. The sacrificial silicon germanium alloy layer 16 that is formed is contiguous layer that covers the entirety of the underlying silicon layer 14. The sacrificial silicon germanium alloy layer 16 that is formed has a low germanium content. By "low germanium content" it is meant a germanium content from 20 atomic percent germanium to 50 atomic percent germanium. The sacrificial silicon germanium alloy layer 16 is employed as a source of germanium for the first condensation process to be subsequently performed.

The sacrificial silicon germanium alloy layer 16 is formed by an epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present application, the sacrificial silicon germanium alloy layer 16 has an epitaxial relationship with the underlying silicon layer 14.

Examples of various epitaxial growth process apparatuses that are suitable for use in forming sacrificial silicon germanium alloy layer 16 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

A number of different sources may be used for the deposition of sacrificial silicon germanium alloy layer 16. In some embodiments, the source gas for the deposition of sacrificial silicon germanium alloy layer 16 may include an admixture of a silicon containing gas source and a germanium containing gas source. Examples of silicon gas sources include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium gas sources include germane, digermane, halogermane, dichlorogermane, trichlorogermane, tetrachlorogermane and combinations thereof. In some embodiments, sacrificial silicon germanium alloy layer 16 can be formed from a source gas that includes a compound containing silicon and germanium. Carrier gases like hydrogen, nitrogen, helium and argon can be used.

In one embodiment, sacrificial silicon germanium alloy layer 16 has a thickness from 5 nm to 20 nm. Other thicknesses that are lesser than, or greater than, the aforementioned thickness range may also be employed as the thickness of sacrificial silicon germanium alloy layer 16.

Figure 3:
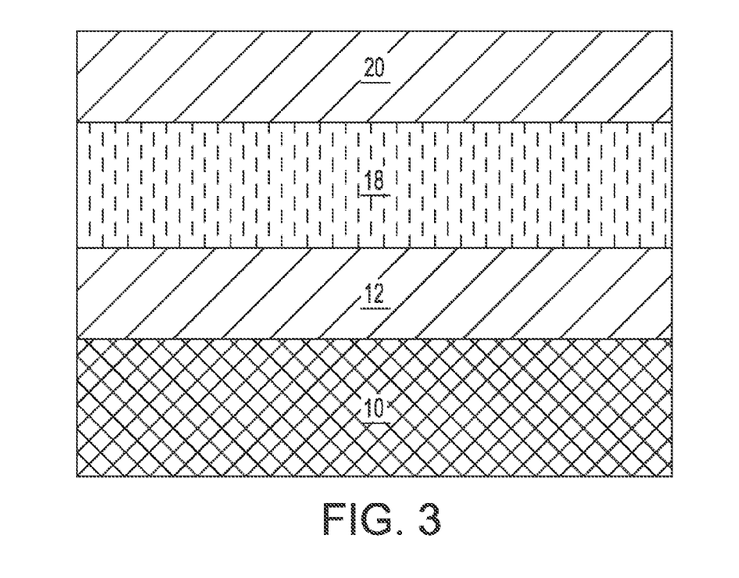
FIG. 3 is a cross sectional view of the exemplary semiconductor structure of FIG. 2 after performing a first condensation process that converts the silicon layer into a silicon germanium alloy layer having a first germanium content, while converting the sacrificial silicon germanium alloy layer into a silicon dioxide layer.

Referring now to FIG. 3, there is illustrated the exemplary semiconductor structure of FIG. 2 after performing a first condensation process that converts the silicon layer 14 into a silicon germanium alloy layer 18 having a first germanium content, while converting the sacrificial silicon germanium alloy layer 16 into a silicon dioxide layer 20. As is shown, the silicon germanium alloy layer 18 having the first germanium content is formed directly on the planar topmost surface of the insulator layer 12, while the silicon dioxide layer 20 is formed on a surface of the silicon germanium alloy layer 18.

The first germanium content of the silicon germanium alloy layer 18 that is provided by this step of the present application can be within the germanium content range mentioned above for the sacrificial germanium alloy layer 16. That is, the first germanium content of silicon germanium alloy can be within a range from 20 atomic percent germanium to 50 atomic percent germanium. In some embodiments, the lower and upper limits of the germanium content of the silicon germanium alloy layer 18 can be slightly less (i.e., less than 0.1 percent) from lower and upper limits of the germanium content of the sacrificial silicon germanium alloy layer 16.

The first condensation process may also be referred to as a first oxidation process since oxygen is present during the process. Notably, the first condensation process can be performed in an oxidizing ambient such as, for example, oxygen, air, ozone, water vapor, and/or $NO_2$. In some embodiments, the oxidizing ambient can be admixed with an inert gas such as, for example, He, Ar and/or Ne. In such an embodiment, the inert gas constitutes from 2 volume % to 95 volume % of an oxidizing ambient containing admixture. The first condensation process can be performed at a temperature from 800° C. to 1300° C. The first condensation process may include a furnace anneal, a rapid thermal anneal or any other anneal that provide the above conversion.

During the first condensation process, Si atoms in the sacrificial silicon germanium alloy layer 16 react with oxygen forming the silicon dioxide layer 20 and Ge atoms from the sacrificial silicon germanium alloy layer 16 diffuse downwards into the underlying silicon layer 14 and react with Si to form the silicon germanium alloy layer 18 mentioned above; the isolation layer 12 serves as a Ge diffusion cap.

In some embodiments, the thickness of silicon germanium alloy layer 18 is from 10 nm to 100 nm. Other thicknesses that are lesser than, or greater than, the aforementioned thickness range may also be employed in the present application. It is noted that the thickness of the silicon germanium alloy layer 18 will determine the height of the subsequently formed silicon germanium alloy fin.

Figure 4A:
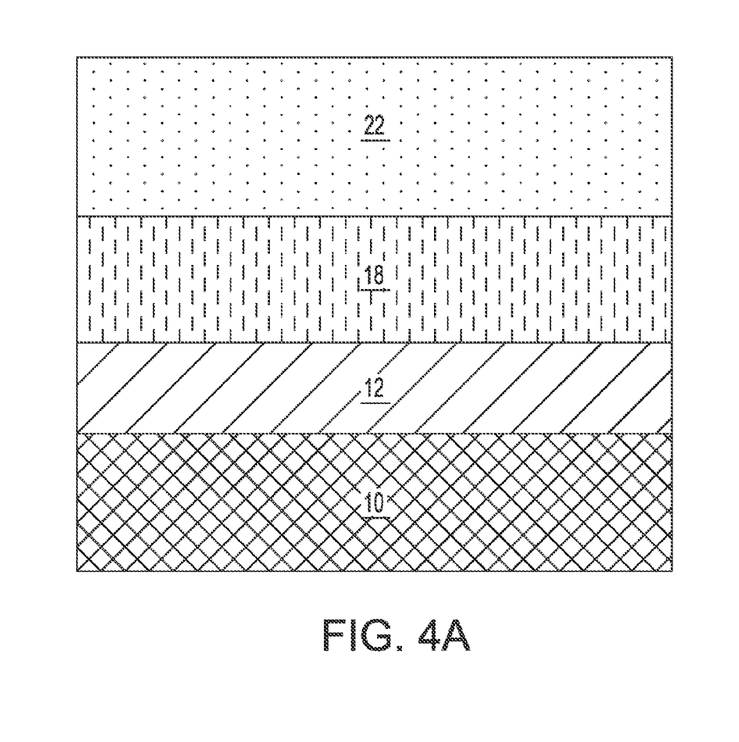
FIG. 4A is a cross sectional view of the exemplary semiconductor structure of FIG. 3 after completely removing the silicon dioxide layer and forming a nitride-containing hard mask layer on an exposed surface of the silicon germanium alloy layer having the first germanium content.

Referring now FIG. 4A, there is illustrated the exemplary semiconductor structure of FIG. 3 after completely removing the silicon dioxide layer 20 and forming a nitride-containing hard mask layer 22 on an exposed surface of the silicon germanium alloy layer 18 having the first germanium content.

Figure 4B:
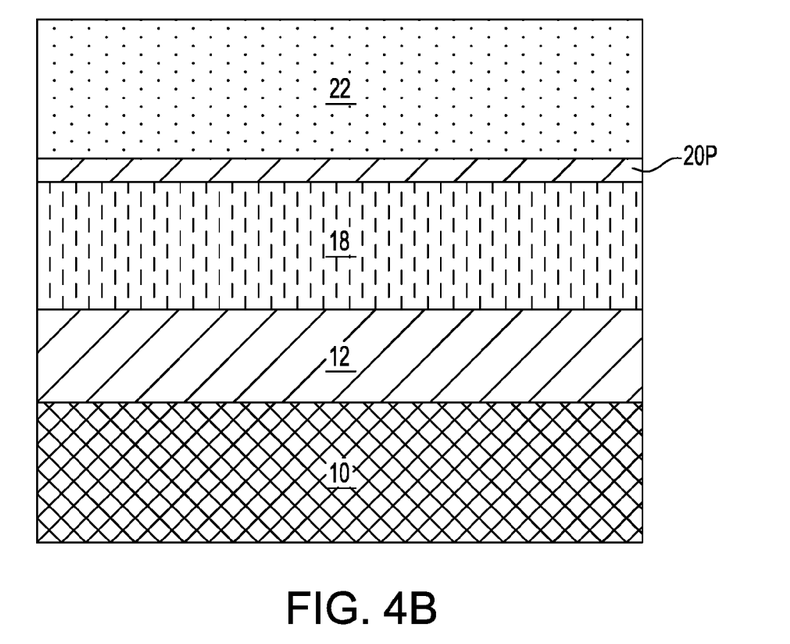
FIG. 4B is a cross sectional view of the exemplary semiconductor structure of FIG. 3 after partially removing the silicon dioxide layer and forming a nitride-containing hard mask layer on an exposed surface of the remaining silicon dioxide layer.

In this embodiment of the present application, the silicon dioxide oxide layer 20 is completely removed from the structure (in FIG. 4B an embodiment is shown in which only a portion of the silicon dioxide layer is removed). In one example, the silicon dioxide layer 20 can be completely removed from atop the silicon germanium alloy layer 18 utilizing a planarization process such as, for example, chemical mechanical polishing and/or grinding. In another example, the silicon dioxide layer 20 can be completely removed from atop the silicon germanium alloy layer 18 utilizing an etching process that stops atop the silicon germanium alloy layer 18. The etching process may include a dry etching process (such as, for example, reactive ion etching or plasma etching) or a chemical wet etch process. The etching process employed in the present application for removing the silicon dioxide layer 20 is selective in removing silicon dioxide as compared to the underlying silicon germanium alloy layer 18. In one embodiment, hydrofluoric acid (HF) or a buffered oxide etching (i.e., a mixture of ammonium fluoride ($NH_4F$) and hydrofluoric acid) can be used to remove the silicon dioxide layer 20 from the structure.

Following the removal of the silicon dioxide layer 20 from the structure, the nitride-containing hard mask layer 22 is formed on the exposed surface of the silicon germanium alloy layer 18. The nitride-containing hard mask layer 22 may include a nitride-containing dielectric material such as, for example, silicon nitride. In one embodiment, the nitride-containing hard mask layer 22 can be formed utilizing a deposition process such as, for example, chemical vapor deposition or plasma enhanced chemical vapor deposition. In another embodiment of the present application, the nitride-containing hard mask layer 22 can be formed utilizing a thermal process such as, for example, thermal nitridation. The nitride-containing hard mask layer 22 can have a thickness from 5 nm to 50 nm. Other thicknesses that are lesser than, or greater than, the aforementioned thickness range may also be employed as the thickness of the nitride-containing hard mask layer 22.

Referring now to FIG. 4B, there is illustrated the exemplary semiconductor structure of FIG. 3 after partially removing the silicon dioxide layer 20 and forming a nitride-containing hard mask layer 22 on an exposed surface of the remaining silicon dioxide layer 20. The remaining silicon dioxide layer 20 can be referred to herein as a silicon dioxide layer portion 20P.

In this embodiment, the silicon dioxide oxide layer 20 is only partially removed utilizing a recess etch or etch back process. The nitride-containing hard mask layer 22 as defined above is then formed atop the silicon dioxide layer portion 20P.

In some embodiments, it is possible to completely remove the silicon dioxide layer 20 formed by the first condensation process and thereafter provide a hard mask stack comprising, from bottom to top, an oxide-containing hard mask layer (i.e., silicon dioxide) and a nitride-containing hard mask layer 22 atop the exposed silicon germanium alloy layer 18. The oxide hard mask layer can be formed by deposition or thermal oxidation.

In either embodiment, the silicon dioxide layer portion 20P or oxide-containing hard mask layer can have a thickness from 5 nm to 20 nm. Other thicknesses that are lesser than, or greater than, the aforementioned thickness range may also be employed as the thickness for the silicon dioxide layer portion 20P or oxide-containing hard mask layer.

Figure 5:
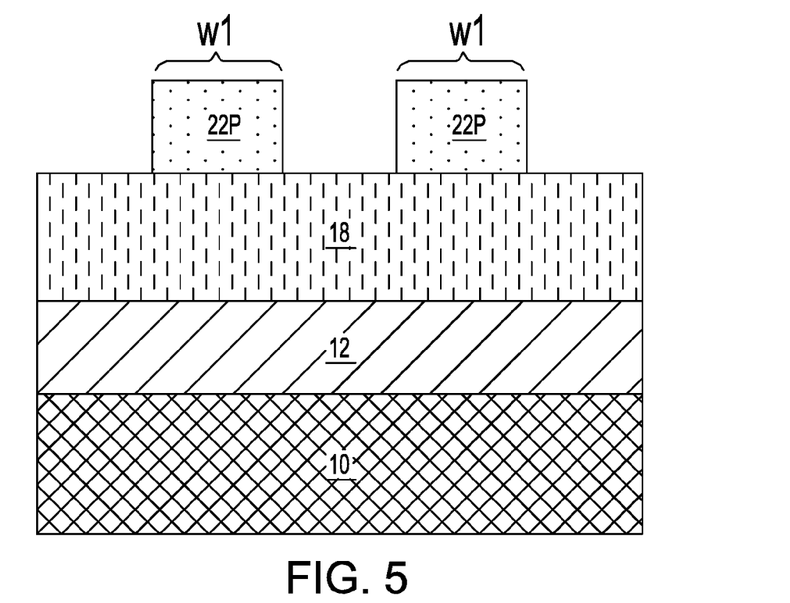
FIG. 5 is a cross sectional view of the exemplary semiconductor structure of FIG. 4A after patterning the nitride-containing hard mask layer to provide at least one nitride-containing hard mask layer portion having a first width.

Referring now to FIG. 5, there is illustrated the exemplary semiconductor structure of FIG. 4A after patterning the nitride-containing hard mask layer 22 to provide at least one nitride-containing hard mask layer portion 22P having a first width, w1. Although the present application describes and illustrates an embodiment in which the structure shown in FIG. 4A is processed to include at least one nitride-containing hard mask layer portion 22P, the structure shown in FIG. 4B can be used and processed to include a patterned hard mask stack of the silicon dioxide layer portion 20P or oxide-containing hard mask layer, and the nitride-containing hard mask layer 22 having the first width, w1.

In accordance with the present application, the first width, w1, is greater than the intended width of a silicon germanium alloy fin to be subsequently formed in the silicon germanium alloy layer 18. In one embodiment of the present application, the first width, w1, of each nitride-containing hard mask layer portion 22P (or the patterned hard mask stack) can be from 12 nm to 30 nm.

In one embodiment of the present application, the patterning process may include lithography and etching. Lithography includes forming a photoresist material (not shown) atop a material or material stack to be patterned; in the present application, the photoresist material is formed atop the nitride-containing hard mask layer 22. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the contiguous layer of hard mask material. The pattern provided by the patterned photoresist material is thereafter transferred into the underlying material layer or material layers (i.e., the nitride-containing hard mask layer 22 or hard mask material stack mentioned above) utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

Figure 6:
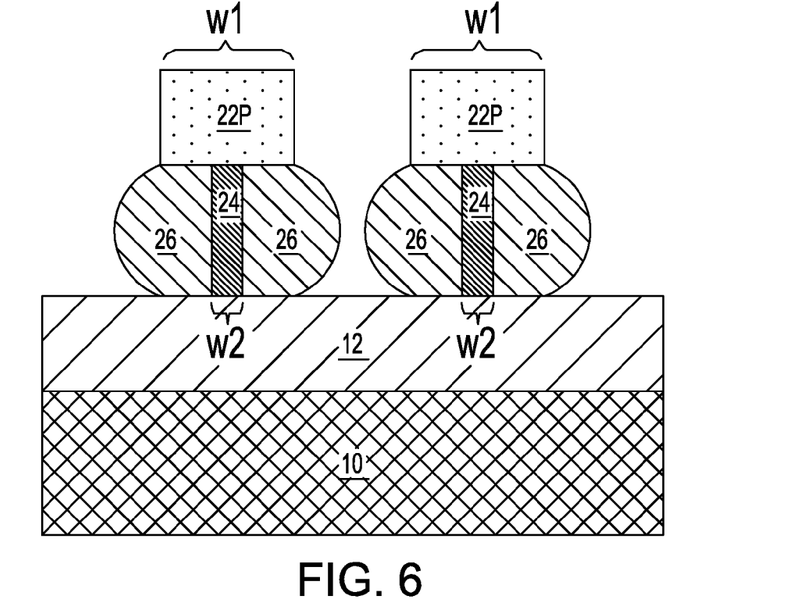
FIG. 6 is a cross sectional view of the exemplary semiconductor structure of FIG. 5 after performing a second condensation process to convert a portion of the silicon germanium alloy layer having the first germanium content beneath each nitride-containing hard mask layer portion into a silicon germanium alloy fin having a second germanium content that is greater than the first germanium content and a second width that is less than the first width, while converting other portions of the silicon germanium alloy layer having the first germanium content into a shell oxide structure.

Referring now to FIG. 6, there is illustrated the exemplary semiconductor structure of FIG. 5 after performing a second condensation process to convert a portion of the silicon germanium alloy layer 18 having the first germanium content beneath each nitride-containing hard mask layer portion 22P into a silicon germanium alloy fin 24 having a second germanium content that is greater than the first germanium content and a second width, w2, that is less than the first width, w1, while converting other portions of the silicon germanium alloy layer 18 having the first germanium content into a shell oxide structure 26. As is shown in the cross sectional view, a shell oxide structure 26 forms on a first sidewall surface of each silicon germanium alloy fin 24, while another shell oxide structure 26 forms on a second sidewall surface of the silicon germanium alloy fin 24 that is opposite the first sidewall surface of the silicon germanium alloy fin 24. Also, the shell oxide structure 26 covers the entirety of the each sidewall surface of the silicon germanium fin 24 and has an outermost edge that protrudes beyond the outermost edges of the nitride-containing hard mask layer portion 22P.

The second germanium content of the silicon germanium alloy fin 24 that is provided by this step of the present application can be greater than 50 atomic percent germanium. In some embodiments, the second germanium content of the silicon germanium alloy fin 24 can be from 70 atomic percent germanium to 100 atomic percent germanium.

As mentioned above, second width, w2, of the silicon germanium alloy fin 24 is less than the first width, w1, of the nitride-containing hard mask layer portion 22P. In one embodiment of the present application, the second width, w2, of the silicon germanium alloy fin 24 can be from 3 nm to 30 nm.

The second condensation process may also be referred to as a second oxidation process since oxygen is present during the process. Notably, the second condensation process can be performed in an oxidizing ambient such as, for example, oxygen, air, ozone, water vapor, and/or $NO_2$. In some embodiments, the oxidizing ambient can be admixed with an inert gas such as, for example, He, Ar and/or Ne. In such an embodiment, the inert gas constitutes from 2 volume % to 95 volume % of an oxidizing ambient containing admixture. The second condensation process can be performed at a temperature from 800° C. to 1300° C. The second condensation process may include a furnace anneal, a rapid thermal anneal or any other anneal that provide the above conversion.

During the second condensation process, Si atoms in portions of the silicon germanium alloy layer 18 that are not covered, or slightly covered, by the nitride-containing hard mask layer portion 22P react with oxygen forming each shell oxide structure 26 and Ge atoms from the silicon germanium alloy layer 18 diffuse laterally into a portion of the silicon germanium alloy layer 18 that is located midway between the edges of the nitride-containing hard mask layer portion 22P and concentration of Ge atoms begins and provides silicon germanium alloy fin 24; the isolation layer 12 and the nitride-containing hard mask layer portion 22P serve as a Ge diffusion cap.

Figure 7:
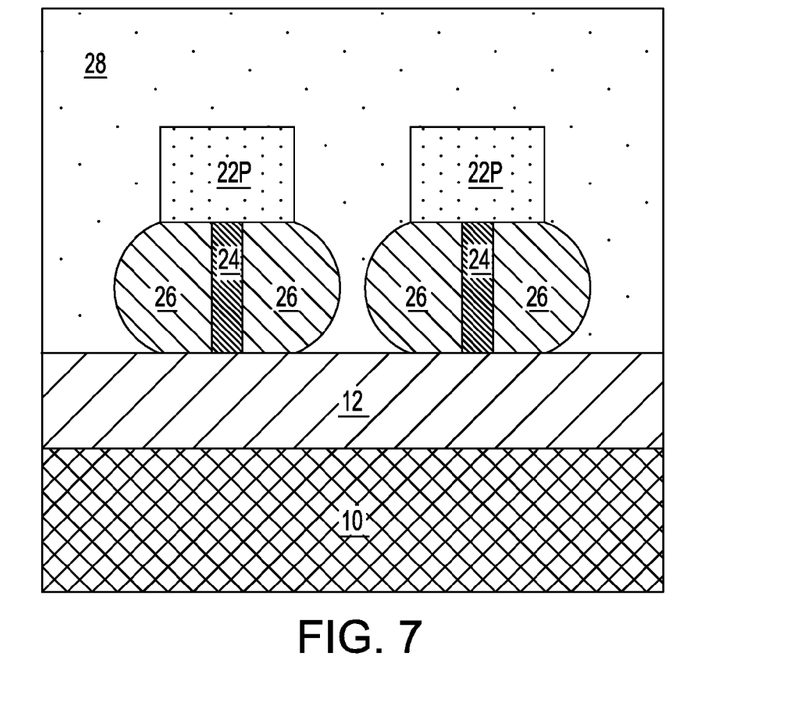
FIG. 7 is a cross sectional view of the exemplary semiconductor structure of FIG. 6 after forming a fin placeholder material surrounding and atop each silicon germanium alloy fin having the second germanium content.

Referring now to FIG. 7, there is illustrated the exemplary semiconductor structure of FIG. 6 after forming a fin placeholder material 28 surrounding and atop each silicon germanium alloy fin 24 having the second germanium content. As is shown, the fin placeholder material 28 is formed around and contacting outermost edge of each shell oxide structure 26 and the fin placeholder material 28 is formed around and contacting sidewall edges and, optionally, a topmost surface of each nitride-containing hard mask layer portion 22P.

The fin placeholder material 28 may comprise any material that has a different etch rate as compared to the nitride-containing hard mask layer portion 22P, the oxide shell structures 26, the silicon germanium alloy fin 24, and the insulator layer 12. In one embodiment of the present application, the fin placeholder material 28 may be a layer of doped or undoped amorphous silicon. In another embodiment of the present application, the fin placeholder material 28 may be a layer of doped or undoped polysilicon. When the fin placeholder material 28 is a doped material, the dopant can be an element from Group III or V of the Periodic Table of Elements. In one example, As is used as the dopant species. In some embodiments, the dopant species can be introduced during the deposition process used to provide the fin placeholder material 28. In other embodiments, the dopant species can be introduced into an intrinsic place holder material 28 by utilizing one of ion implantation or gas phase doping. In some embodiments, a doped fin placeholder material 28 may allow some advantage for the shell oxide structure 26 recess process to be subsequently performed in that a doped fin placeholder material 28 will recess a little during the recess of the oxide shell structure allowing one to access the shell oxide structure 26 more easily.

The fin placeholder material 28 can be formed utilizing a deposition process such as, for example, chemical vapor deposition, plasma enhanced chemical vapor deposition or physical vapor deposition. The fin placeholder material 28 can have any thickness so long as the fin placeholder material 28 has a topmost surface that is coplanar with, or above the topmost surface of the nitride-containing hard mask layer portion 22P.

Figure 8:
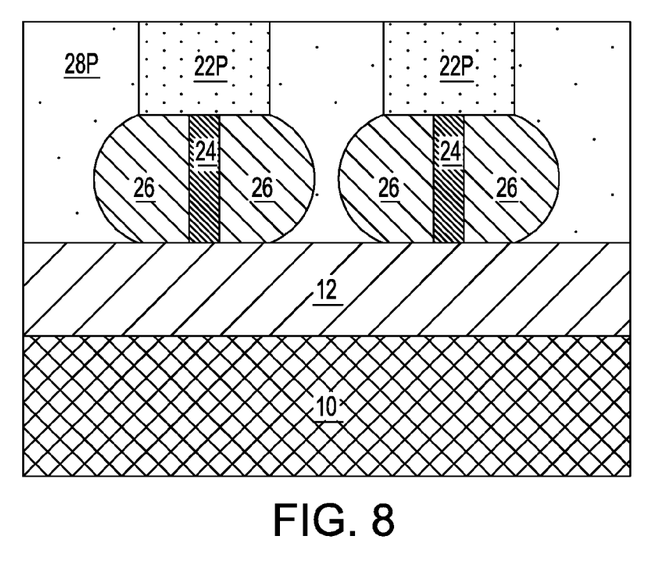
FIG. 8 is a cross sectional view of the exemplary semiconductor structure of FIG. 7 after planarizing the fin placeholder material to expose a topmost surface of each nitride-containing hard mask layer portion.

Referring now to FIG. 8, there is illustrated the exemplary semiconductor structure of FIG. 7 after planarizing the fin placeholder material 28 to expose a topmost surface of each hard mask layer portion 22P. In some embodiments of the present application and when the fin placeholder material 28 has a topmost surface that is coplanar with a topmost surface of the nitride-containing hard mask layer portion 22P this step of the present application may be omitted. The planarizing process used to provide the exemplary semiconductor structure shown in FIG. 8 may include chemical mechanical polishing or grinding. The fin placeholder material 28 having a topmost surface that is coplanar with a topmost surface of each nitride-containing hard mask layer portion 22P may be referred to herein as fin placeholder material portion 28P.

Figure 9:
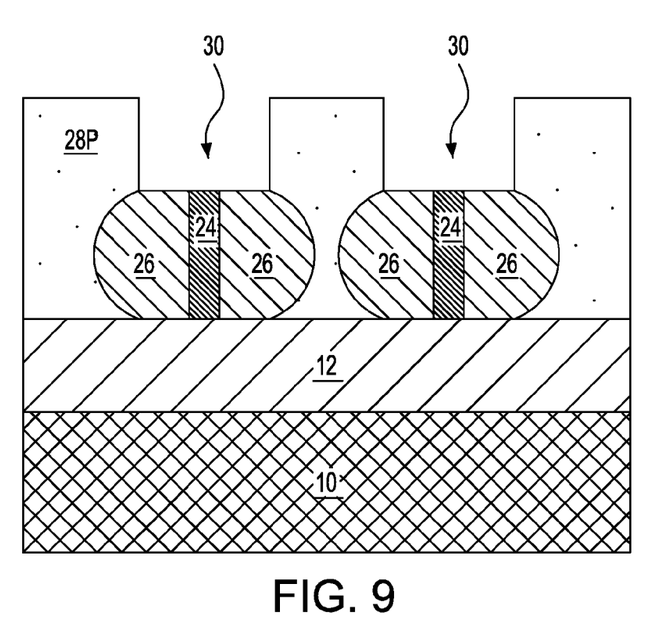
FIG. 9 is a cross sectional view of the exemplary semiconductor structure of FIG. 8 after removing each nitride-containing hard mask layer portion.

Referring now to FIG. 9, there is illustrated the exemplary semiconductor structure of FIG. 8 after removing each nitride-containing hard mask layer portion 22P. In the illustrated embodiment, this step of the present application provides an opening 30 the exposes topmost surfaces of each silicon germanium alloy fin 24 and each shell oxide structure 26. The removal of the nitride-containing hard mask layer portion 22 may include an anisotropic etch that selectively removes a nitride as compared to an oxide, the material of the fin placeholder material portion 28P and the silicon germanium alloy fin 24. In one example, hot phosphoric acid may be used. In the case of the patterned hard mask containing from, bottom to top, an oxide portion and a nitride-containing hard mask layer portion 22P, the nitride-containing layer portion 22P is removed stopping on the oxide portion. The oxide portion can be removed during the subsequent recessing of the shell oxide structures 26. In such an embodiment, the opening 30 would expose a topmost surface of the oxide portion of the patterned hard mask.

Figure 10:
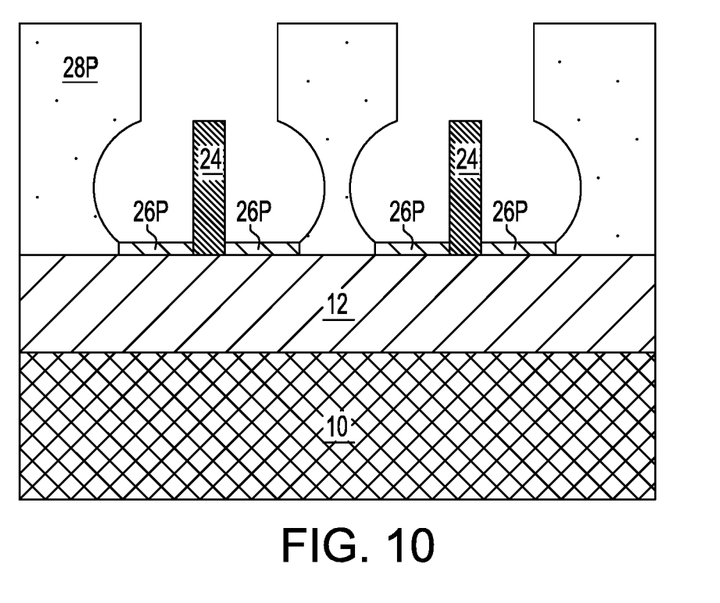
FIG. 10 is a cross sectional view of the exemplary semiconductor structure of FIG. 9 after partially removing each shell oxide structure to provide shell oxide structure portions, each shell oxide structure portion has a sidewall surface directly contacting a lower sidewall surface of the silicon germanium alloy fin, a bottommost surface directly contacting a portion of the insulator layer and a topmost surface that is located beneath a topmost surface of the silicon germanium alloy fin.

Referring now to FIG. 10, there is illustrated the exemplary semiconductor structure of FIG. 9 after partially removing, i.e., recessing, each shell oxide structure 26 to provide shell oxide structure portions 26P, each shell oxide structure portion 26P has a sidewall surface directly contacting a lower sidewall surface of the silicon germanium alloy fin 24, a bottommost surface directly contacting a portion of the insulator layer 12 and a topmost surface that is located beneath a topmost surface of the silicon germanium alloy fin 24. During this step of the present application and if present, the oxide portion of the patterned hard mask can be removed.

The recessing of each shell oxide structure 26 can include a time controlled wet etch process in which a chemical etchant that selectively removes oxide is used. In one example, the chemical etchant that can be used to recess each shell oxide structure 26 may include HF or a buffered etch as mentioned above.

Figure 11:
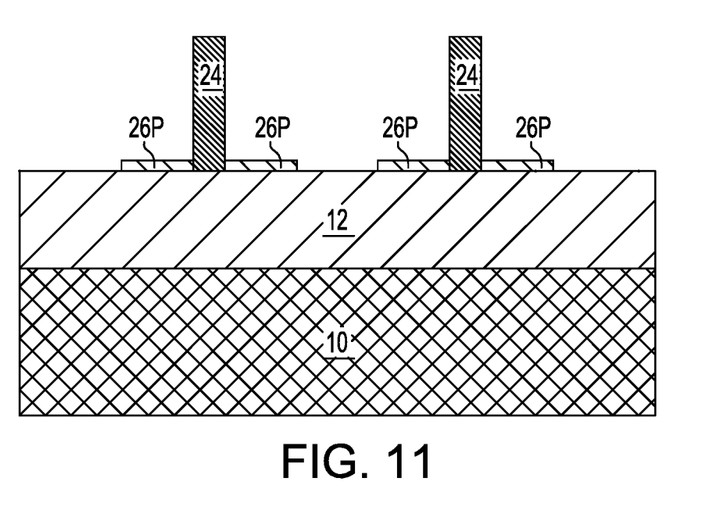
FIG. 11 is a cross sectional view of the exemplary semiconductor structure of FIG. 10 after removing the remaining fin placeholder material.

Referring now to FIG. 11, there is illustrated the exemplary semiconductor structure of FIG. 10 after removing the remaining fin placeholder material 28 (i.e. the fin placeholder material portion 28P). The removal of the fin placeholder material portion 28P may be performed utilizing an etching process that selectively removes the material that provides the fin placeholder material portion 28P. In one example, and when the fin placeholder material portion 28P comprises amorphous silicon, tetramethylammonium hydroxide (TMAH) may be used.

Notably, FIG. 11 illustrates a semiconductor structure in accordance with the present application. As is shown, the semiconductor structure includes at least one silicon germanium alloy fin 24 of the second germanium content (i.e., having a germanium content of greater than 50 atomic percent) located on a portion of an entirely planar topmost surface of an insulator layer 12. The semiconductor structure of the present application further includes a shell oxide structure portion 26P located on each side of the at least one silicon germanium alloy fin 24. Each shell oxide structure portion 26P has a sidewall surface directly contacting a lower sidewall surface of the at least one silicon germanium alloy fin 24, a bottommost surface directly contacting another portion of the entirely planar topmost surface of the insulator layer 12 and a topmost surface that is located beneath a topmost surface of the at least one silicon germanium alloy fin 24. Each shell oxide structure portion 26P includes another sidewall surface opposite the sidewall surface that directly contacts the lower sidewall surface of the least one silicon germanium alloy fin 24, the another sidewall surface of the shell oxide portion does not extend to outermost edges of the insulator layer 12. Thus, a portion of the topmost surface of the insulator layer 12 is exposed.

Figure 12:
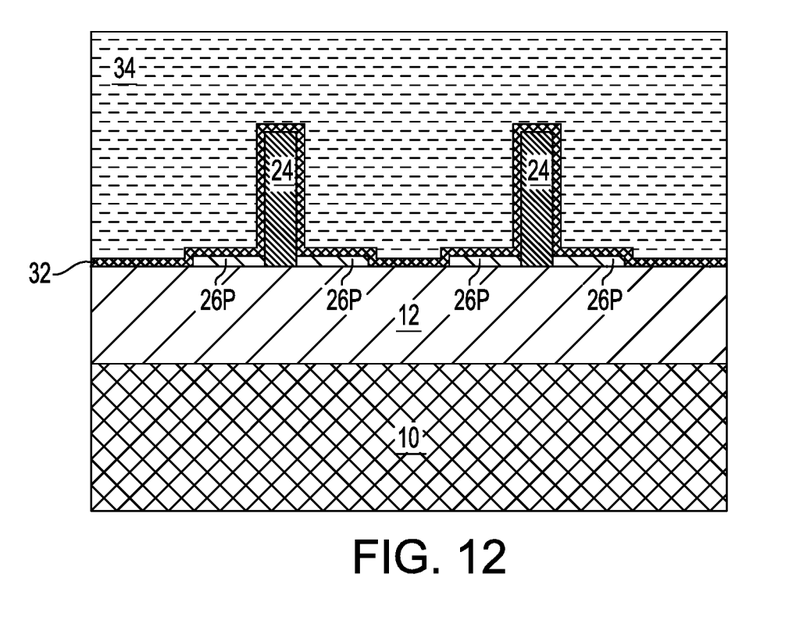
FIG. 12 is a cross sectional view of the exemplary semiconductor structure of FIG. 11 after forming a functional gate structure straddling over a portion of the silicon germanium alloy fin.

Referring now to FIG. 12, there is illustrated the exemplary semiconductor structure of FIG. 11 after forming a functional gate structure (32, 34) straddling over a portion of the silicon germanium alloy fin 24. By "functional gate structure" it is meant a permanent gate structure used to control output current (i.e., flow of carriers in the channel) of a semiconducting device through electrical or magnetic fields. Although a single functional gate structure is described and illustrated, a plurality of functional gate structures can be formed straddling over different portions of each silicon germanium alloy fin 24.

Each functional gate structure includes a gate material stack of, from bottom to top, a gate dielectric portion 32 and a gate conductor portion 34. In some embodiments, a gate cap portion (not shown) can be present atop each gate conductor portion 34.

Each gate dielectric portion 32 of the functional gate structure comprises a gate dielectric material. The gate dielectric material that provides each gate dielectric portion 32 can be an oxide, nitride, and/or oxynitride. In one example, the gate dielectric material that provides each gate dielectric portion 32 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as each gate dielectric portion 32. In some embodiments, each gate dielectric portion 32 comprises a same gate dielectric material. In other embodiments, a first set of functional gate structures comprises a first gate dielectric material while a second set of functional gate structures comprises a second gate dielectric material that differs from the first gate dielectric material.

The gate dielectric material used in providing each gate dielectric portion 32 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions 32 of different functional gate structures, block mask technology can be used. In one embodiment of the present application, the gate dielectric material used in providing each gate dielectric portion 32 can have a thickness in a range from 1 nm to 10 nm. Other thicknesses that are lesser than, or greater than, the aforementioned thickness range can also be employed for the gate dielectric material.

Each gate conductor portion 34 of the functional gate structure comprises a gate conductor material. The gate conductor material used in providing each gate conductor portion 34 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, each gate conductor portion 34 comprises a same conductive material. In other embodiments, the gate conductor portion of a first functional gate structure comprises a different gate conductor material than a gate conductor portion of a second set of functional gate structures. For example, the gate conductor portion of a first set of functional gate structure may comprise an nFET gate metal, while the gate conductor portion of a second set of functional gate structure may comprise a pFET gate metal.

The gate conductor material used in providing each gate conductor portion 34 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing each gate conductor portion 34 has a thickness from 1 nm to 100 nm. Other thicknesses that are lesser than, or greater than, the aforementioned thickness range can also be employed for the gate conductor material used in providing each gate conductor portion 34.

If present, the gate cap portion of the functional gate structure comprises a gate cap material. The gate cap material that provides the gate cap portion may include one of the hard mask materials mentioned above. In one embodiment, each gate cap portion comprises silicon dioxide, silicon nitride, and/or silicon oxynitride. The material that provides the gate cap portion can be formed utilizing a conventional deposition process such as, for example, chemical vapor deposition or plasma enhanced chemical vapor deposition. The material that provides the gate cap portion can have a thickness from 5 nm to 20 nm. Other thicknesses that are lesser than, or greater than, the aforementioned thickness range can also be employed as the thickness of the material that provides the gate cap portion.

The functional gate structure can be formed by providing a functional gate material stack of, from bottom to top, the gate dielectric material, the gate conductor material and, if present, the gate cap material. The gate material stack can then be patterned. In one embodiment of the present application, patterning of the functional gate material stack may be performed utilizing lithography and etching, as defined above.

In other embodiments of the present application, and prior to forming functional gate structure, a sacrificial gate structure is formed instead of a functional gate structure. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the gate dielectric portion. Each sacrificial gate material portion includes one of the gate conductor materials mentioned above for the gate conductor portion. The sacrificial gate cap portion includes one of the gate cap materials mentioned above for each gate cap portion. The sacrificial gate structures can be formed by deposition of the various material layers and then patterning the resultant sacrificial dielectric material sack by utilizing, for example, lithography and etching.

After forming the gate structures (functional and/or sacrificial gate structures), dielectric spacers (not shown) can be formed on exposed sidewall surfaces of the respective gate structure. The dielectric spacers may comprise a spacer dielectric material such as, for example, silicon dioxide and/or silicon nitride. The dielectric spacers can be formed by depositing a spacer material and thereafter a spacer etch can be performed. Next, a source region (not shown) is formed on one side of each gate structure and a drain region (not shown) is formed on another side of each gate structure. The source region and the drain region would run into an out of the plane of the paper including the exemplary semiconductor structure shown in FIG. 12. The source/drain regions may include formation of a doped epitaxial semiconductor material on exposed portions of each silicon germanium alloy fin 24. In one embodiment, the doped epitaxial semiconductor material of one silicon germanium alloy fin 24 that is formed may merge with another doped epitaxial semiconductor material of another silicon germanium alloy fin 24. In another embodiment, the doped epitaxial semiconductor material of one silicon germanium alloy fin 24 that is formed may remain unmerged from another doped epitaxial semiconductor material of another silicon germanium alloy fin 24.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
at least one silicon germanium alloy fin having a germanium content of greater than 50 atomic percent and located on a portion of an entirely planar topmost surface of an insulator layer;
a shell oxide structure portion located on each side of the at least one silicon germanium alloy fin, each shell oxide structure portion having a sidewall surface directly contacting a lower portion of a sidewall surface of the at least one silicon germanium alloy fin, a bottommost surface directly contacting another portion of the entirely planar topmost surface of the insulator layer, a topmost surface that is located beneath a topmost surface of the at least one silicon germanium alloy fin, and another sidewall surface, opposite the sidewall surface that directly contacts the lower sidewall surface of the at least one silicon germanium alloy fin, that does not extend to outermost edges of the insulator layer; and a functional gate structure straddling over a portion of the at least one silicon germanium alloy fin, wherein a gate dielectric portion of the functional gate structure directly contacts the another sidewall surface of the shell oxide structure portion, the topmost surface of the shell oxide structure portion, remaining portions of each sidewall surface and the topmost surface of the at least one silicon germanium alloy fin, and a portion of the insulator layer not contacting the shell oxide structure portion and the silicon germanium alloy fin.

2. The semiconductor structure of claim 1, wherein the germanium content of the at least one silicon germanium alloy fin is from 70 atomic percent to 100 atomic percent.

3. The semiconductor structure of claim 1, further comprising a handle substrate located beneath the insulator layer.

4. The semiconductor structure of claim 1, wherein each shell oxide structure portion and the insulator layer comprises a same dielectric material oxide.

5. The semiconductor structure of claim 4, wherein the dielectric material is silicon dioxide oxide.

6. The semiconductor structure of claim 1, wherein each shell oxide structure portion and the insulator layer comprise a different dielectric material oxide.

7. The semiconductor structure of claim 1, wherein the silicon germanium alloy fin has a width from 3 nm to 30 nm.

8. A semiconductor structure comprising:
a first silicon germanium alloy fin having a germanium content of greater than 50 atomic percent and located on a first portion of an entirely planar topmost surface of an insulator layer;
a second silicon germanium alloy fin having the germanium content of the first silicon germanium alloy fin and located on a second portion of the entirely planar topmost surface of the insulator layer;
a shell oxide structure portion located on each side of the first and second silicon germanium alloy fins, each shell oxide structure portion having a sidewall surface directly contacting a lower portion of a sidewall surface of one of the silicon germanium alloy fins, a bottommost surface directly contacting another portion of the entirely planar topmost surface of the insulator layer, a topmost surface that is located beneath a topmost surface of the first and second silicon germanium alloy fins and another sidewall surface, opposite the sidewall surface that directly contacts the lower sidewall surface of the at least one silicon germanium alloy fin, that does not extend to outermost edges of the insulator layer; and a functional gate structure straddling over a portion of the first and second silicon germanium alloy fins, wherein a gate dielectric portion of the functional gate structure directly contacts the another sidewall surface of the shell oxide structure portion, the topmost surface of each shell oxide structure portion, remaining portions of each sidewall surface and the topmost surface of the first and second silicon germanium alloy fins, and a portion of the insulator layer not contacting the shell oxide structure portion and the first and second silicon germanium alloy fins.

9. The semiconductor structure of claim 8, wherein the germanium content of the first and second silicon germanium alloy fins is from 70 atomic percent to 100 atomic percent.

10. The semiconductor structure of claim 8, further comprising a handle substrate located beneath the insulator layer.

11. The semiconductor structure of claim 8, wherein each shell oxide structure portion and the insulator layer comprises a same dielectric material oxide.

12. The semiconductor structure of claim 11, wherein the dielectric material oxide is silicon dioxide.

13. The semiconductor structure of claim 8, wherein each shell oxide structure portion and the insulator layer comprise a different dielectric material oxide.

* * * * *